(12) United States Patent
Bonart

(10) Patent No.: US 10,297,583 B2
(45) Date of Patent: May 21, 2019

(54) SEMICONDUCTOR DEVICE PACKAGE AND METHODS OF PACKAGING THEREOF

(71) Applicant: Infineon Technologies AG, Neubiberg (DE)

(72) Inventor: Dietrich Bonart, Bad Abbach (DE)

(73) Assignee: Infineon Technologies AG, Neubiberg (DE)

(*) Notice: Subject to any disclaimer, the term of this patent is extended or adjusted under 35 U.S.C. 154(b) by 25 days.

(21) Appl. No.: 14/478,944

(22) Filed: Sep. 5, 2014

(65) Prior Publication Data

US 2016/0064362 A1 Mar. 3, 2016

Related U.S. Application Data

(63) Continuation of application No. 13/590,999, filed on Aug. 21, 2012, now Pat. No. 8,846,452.

(51) Int. Cl.
*H01L 25/16* (2006.01)
*H01L 21/768* (2006.01)
(Continued)

(52) U.S. Cl.
CPC ............ *H01L 25/16* (2013.01); *H01L 21/768* (2013.01); *H01L 21/78* (2013.01); *H01L 23/3178* (2013.01); *H01L 23/522* (2013.01); *H01L 23/528* (2013.01); *H01L 23/5221* (2013.01); *H01L 24/24* (2013.01); *H01L 24/82* (2013.01); *H01L 24/83* (2013.01); *H01L 24/94* (2013.01); *H01L 25/0655* (2013.01);
(Continued)

(58) Field of Classification Search
CPC ................ H01L 24/01; H01L 2224/01; H01L 2224/08135; H01L 2224/83191; H01L 2224/94; H01L 2924/00; H01L 2924/151; H01L 2924/15153; H01L 2224/97; H01L 24/97
USPC .................................. 438/106, 107, 110, 112
See application file for complete search history.

(56) References Cited

U.S. PATENT DOCUMENTS

| 6,724,638 B1 | 4/2004 | Inagaki et al. |
| 2002/0110952 A1* | 8/2002 | Gris ........................ H01L 24/24 438/106 |

(Continued)

FOREIGN PATENT DOCUMENTS

| DE | 4238137 A1 | 5/1994 |
| DE | 19720300 A1 | 12/1997 |

(Continued)

*Primary Examiner* — David C Spalla
(74) *Attorney, Agent, or Firm* — Murphy, Bilak & Homiller, PLLC

(57) ABSTRACT

An embodiment of the present invention describes a method for forming a doped region at a first major surface of a semiconductor substrate where the first doped region being part of a first semiconductor device. The method includes forming an opening from the first major surface into the semiconductor substrate and attaching a semiconductor die to the semiconductor substrate at the opening. The semiconductor die includes a second semiconductor device, which is a different type of semiconductor device than the first semiconductor device. The method further includes forming a chip isolation region on sidewalls of the opening and surrounding the second semiconductor device, and singulating the semiconductor substrate.

17 Claims, 10 Drawing Sheets

(51) Int. Cl.
*H01L 21/78* (2006.01)
*H01L 23/528* (2006.01)
*H01L 25/00* (2006.01)
*H01L 25/18* (2006.01)
*H01L 23/522* (2006.01)
*H01L 29/06* (2006.01)
*H01L 23/00* (2006.01)
*H01L 23/31* (2006.01)
*H01L 25/065* (2006.01)

(52) U.S. Cl.
CPC ............. *H01L 25/18* (2013.01); *H01L 25/50* (2013.01); *H01L 29/0657* (2013.01); *H01L 24/32* (2013.01); *H01L 2224/24147* (2013.01); *H01L 2224/29124* (2013.01); *H01L 2224/29157* (2013.01); *H01L 2224/29166* (2013.01); *H01L 2224/29181* (2013.01); *H01L 2224/29184* (2013.01); *H01L 2224/32145* (2013.01); *H01L 2224/32502* (2013.01); *H01L 2224/32506* (2013.01); *H01L 2224/73267* (2013.01); *H01L 2224/82097* (2013.01); *H01L 2224/8383* (2013.01); *H01L 2224/83191* (2013.01); *H01L 2224/83894* (2013.01); *H01L 2224/92244* (2013.01); *H01L 2224/94* (2013.01); *H01L 2924/01322* (2013.01); *H01L 2924/1301* (2013.01); *H01L 2924/1305* (2013.01); *H01L 2924/1306* (2013.01); *H01L 2924/15153* (2013.01); *H01L 2924/15165* (2013.01); *H01L 2924/181* (2013.01)

(56) References Cited

U.S. PATENT DOCUMENTS

| | | | |
|---|---|---|---|
| 2004/0214373 A1 | 10/2004 | Jiang et al. | |
| 2005/0122698 A1* | 6/2005 | Ho | H01L 23/5389 361/761 |
| 2005/0258537 A1 | 11/2005 | Huang et al. | |
| 2006/0088987 A1* | 4/2006 | Yeo | H01L 27/115 438/488 |
| 2006/0214288 A1* | 9/2006 | Ohsumi | H01L 23/13 257/724 |
| 2007/0007641 A1 | 1/2007 | Lee et al. | |
| 2009/0057903 A1* | 3/2009 | Okayama | H01L 23/5389 257/741 |
| 2009/0206466 A1 | 8/2009 | Shinkai et al. | |
| 2010/0044853 A1* | 2/2010 | Dekker | B81C 1/00087 257/692 |
| 2010/0075463 A1 | 3/2010 | Smith et al. | |
| 2010/0140803 A1 | 6/2010 | Sakamoto et al. | |
| 2011/0156228 A1* | 6/2011 | Kobayashi | H01L 23/3677 257/676 |
| 2011/0201155 A1* | 8/2011 | Kuroda | H01L 21/4853 438/113 |
| 2011/0233718 A1 | 9/2011 | Kim et al. | |
| 2012/0091594 A1* | 4/2012 | Landesberger | H01L 23/3121 257/774 |
| 2012/0319295 A1* | 12/2012 | Chi | H01L 21/561 257/774 |
| 2012/0326264 A1* | 12/2012 | Fukushima | H01L 27/1266 257/499 |
| 2013/0105950 A1* | 5/2013 | Bergemont | H01L 23/552 257/659 |
| 2013/0119556 A1 | 5/2013 | Liu et al. | |
| 2013/0147472 A1* | 6/2013 | French | G01R 33/032 324/252 |
| 2014/0021610 A1* | 1/2014 | Von Koblinski | H01L 23/44 257/741 |

FOREIGN PATENT DOCUMENTS

| | | |
|---|---|---|
| JP | 031580 A | 1/1991 |
| JP | 0352273 A | 3/1991 |

* cited by examiner

SEMICONDUCTOR DEVICE PACKAGE AND METHODS OF PACKAGING THEREOF

This application is a continuation of U.S. Non Provisional application Ser. No. 13/590,999, entitled "Semiconductor Device Package and Methods of Packing Thereof," filed on Aug. 21, 2012, which application is hereby incorporated herein by reference.

TECHNICAL FIELD

The present invention relates generally to packaging, and more particularly to semiconductor device package and methods of packaging thereof.

BACKGROUND

Semiconductor devices are used in many electronic and other applications. Semiconductor devices comprise integrated circuits or discrete devices that are formed on semiconductor wafers by depositing many types of thin films of material over the semiconductor wafers, and patterning the thin films of material.

There is a demand in semiconductor device technology to integrate many different functions on a single chip, e.g., manufacturing on the same die analog and digital circuitry, power devices and logic devices, or others. In such applications, many different components are integrated into a single chip. However such integration creates additional challenges that need to be overcome. Alternatively, different types of circuitry may be formed in separate dies and packaged together. However, packaging of multiple chips has many degrading effects on the performance of the semiconductor device.

SUMMARY OF THE INVENTION

In accordance with an embodiment of the present invention, a method of forming a semiconductor device comprises forming an opening within a semiconductor substrate, attaching a semiconductor die to the semiconductor substrate at the opening, and singulating the semiconductor substrate.

In accordance with another embodiment of the present invention, a method of forming a semiconductor device comprises forming a device region in a first region of a semiconductor substrate, and forming an opening in a second region of the semiconductor substrate. The method further comprises placing a semiconductor die within the opening, and forming a first metallization level over the semiconductor die and the device region.

In accordance with another embodiment of the present invention, a semiconductor device comprises a device region disposed within a semiconductor substrate, an opening within the semiconductor substrate and proximate the device region, and a semiconductor die disposed in the opening. The semiconductor die is attached to the semiconductor substrate at the opening.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A and 1B, illustrates a semiconductor device in accordance with an embodiment of the present invention, wherein FIG. 1A illustrates a top view and FIG. 1B illustrates a cross sectional view;

FIG. 2, which includes FIGS. 2A and 2B, illustrates a semiconductor device in accordance with an embodiment of the present invention, wherein FIG. 2A illustrates a top view and FIG. 2B illustrates a cross sectional view;

FIG. 4, which includes FIGS. 4A and 4B, illustrates a semiconductor device after the formation of device regions in accordance with embodiments of the present invention, wherein FIG. 4A illustrates a cross-sectional view, and wherein FIG. 4B illustrates a top view;

FIG. 6, which includes

FIG. 10, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Many applications require integration of vastly different circuits. For example, power chips are frequently combined with logic chips in a power module. However, many of these different circuits may require the use of an incompatible processes. Otherwise, they may require complex integration resulting in a large increase in production costs. Therefore, in such cases, multiple dies may be separately fabricated and packaged together. Such packaging increases packaging costs and also increases parasitic effects and reduces thermo-mechanical stability, which result in degrading the performance of the combined package. Embodiments of the invention overcome these problems by describing a process to combine the advantages of having separate process fabrication but without the added cost and performance degradation of multichip packaging.

A structural embodiment of the present invention will be described using FIG. 1. Further structural embodiments will be described using FIGS. 2-3. A method of fabricating the semiconductor device will be described using FIGS. 4-10. Further embodiments of fabricating the semiconductor device will be described using FIGS. 11-13.

Figure 1A:
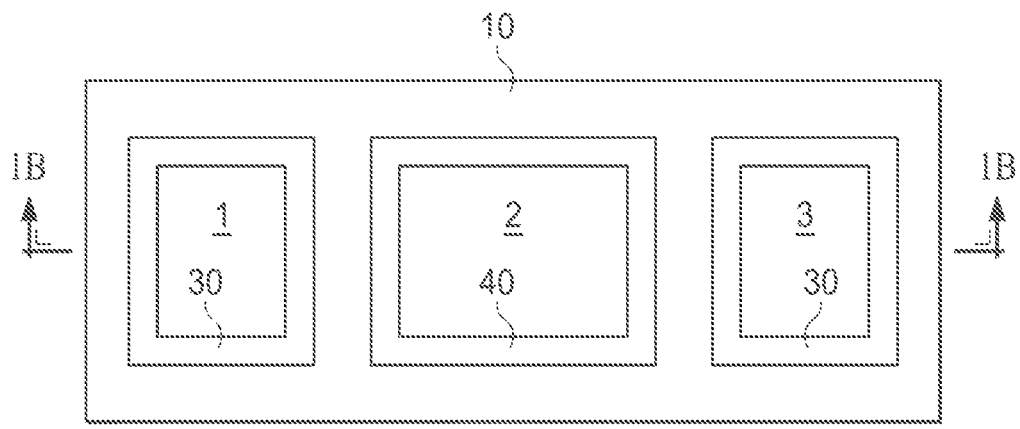
Figure 1B:
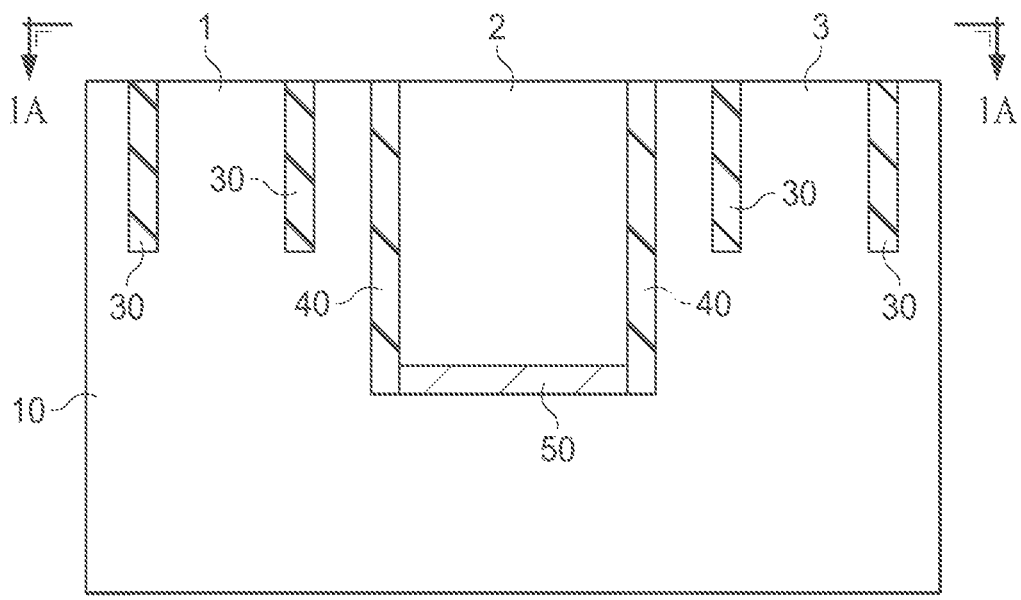

FIG. 1, which includes FIGS. 1A and 1B, illustrates a semiconductor device in accordance with an embodiment of the present invention. FIG. 1A illustrates a top view and FIG. 1B illustrates a cross sectional view.

Referring to FIG. 1A, the semiconductor device comprises a first circuit 1, a second circuit 2, and a third circuit 3. The second circuit 2 is disposed between the first circuit 1 and the third circuit 3. In various embodiments, the first circuit 1 and the second circuit 2 may comprise power circuits. In one embodiment, the first circuit 1 may be a discrete semiconductor device, the third circuit 3 may be a discrete semiconductor device while the second circuit 2 may comprise a integrated circuit. The first circuit 1 and the third circuit 3 may provide power to the second circuit 2 in one embodiment.

In various embodiments, the second circuit 2 is different from the first circuit 1 and the third circuit 3. In one embodiment, the second circuit 2 comprises a different semiconductor material than the first circuit 1 and the third circuit 3. For example, the second circuit 2 may comprise devices formed on germanium, silicon carbide, III-V, II-IV compounds such as gallium nitride, gallium arsenide while the first circuit 1 and the third circuit 3 may comprise devices formed on silicon. In another embodiment, the second circuit 2 comprises a different metallization scheme than the first circuit 1 and the third circuit 3. For example, the first circuit 1 and the third circuit 3 may comprise two metal levels while the second circuit 2 may comprise more than four metal levels, e.g., ten metal levels.

The first circuit 1 and the third circuit 3 are isolated by isolation regions 30 while the second circuit 2 may be isolated by chip isolation regions 40. The isolation regions 30 may surround the first circuit 1 and the second circuit 3 while the chip isolation regions 40 may surround the second circuit 2 in one embodiment.

Referring to FIG. 1B, the isolation regions 30 may be disposed around the first circuit 1 and the third circuit 3 as shallow trench isolation in one embodiment. The chip isolation region 40 may be disposed around the second circuit 2, for example, as a deep trench isolation structure. The second circuit 2 may be coupled to the substrate 10 through a conductive adhesive layer 50. In one or more embodiments, the conductive adhesive layer 50 comprises aluminum and silicon. In one or more embodiments, the conductive adhesive layer 50 comprises a silicide. In one or more embodiments, the conductive adhesive layer 50 comprises tungsten, titanium, tantalum, cobalt, and others. In one embodiment, the conductive adhesive layer 50 comprises a eutectic material. For example, in one embodiment, the conductive adhesive layer 50 comprises a eutectic comprising aluminum and silicon. The isolation regions 30 may be disposed around the first circuit 1 and the third circuit 3 as a shallow trench isolation in one embodiment.

Figure 2A:
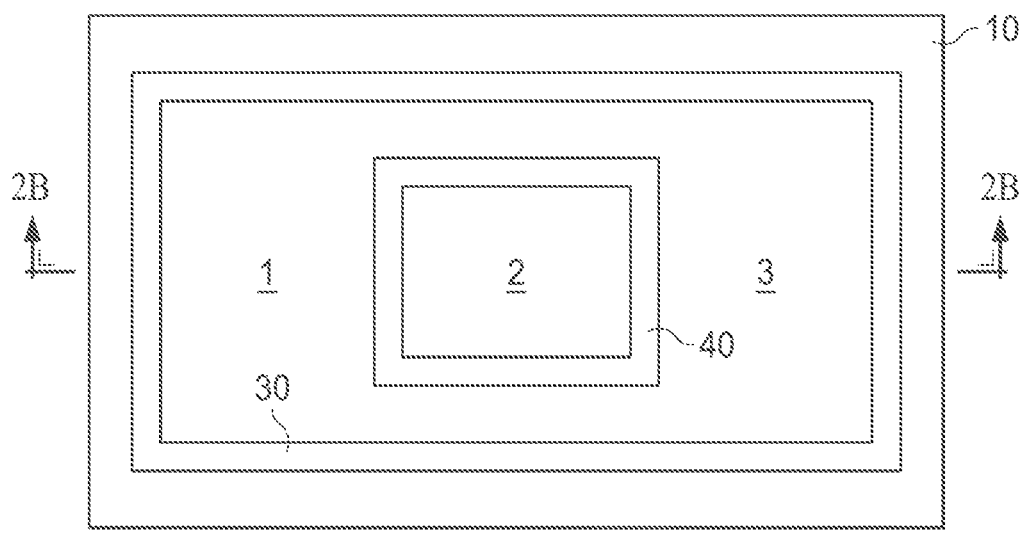
Figure 2B:
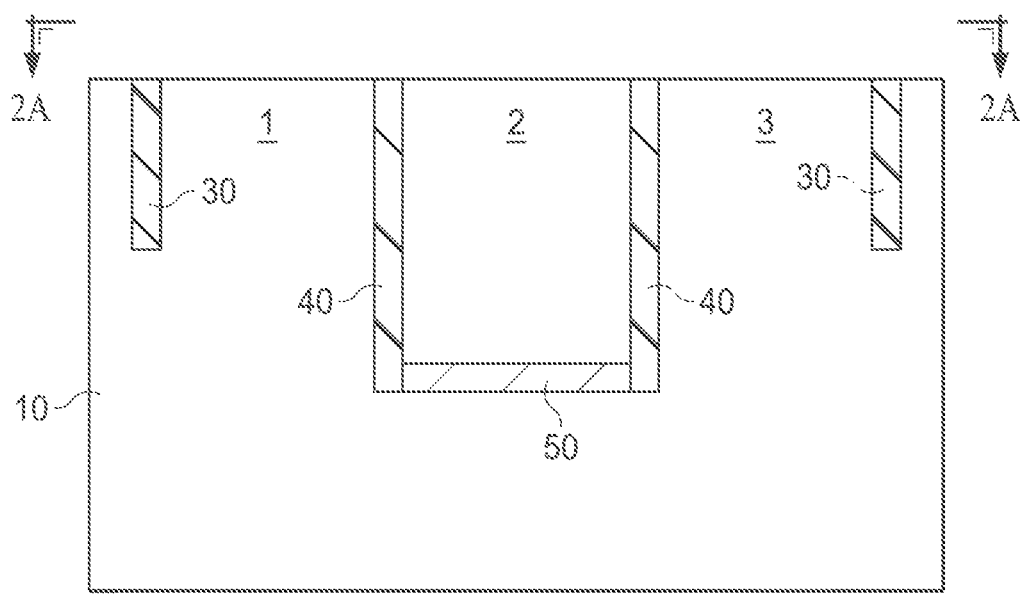

FIG. 2, which includes FIGS. 2A and 2B, illustrates a semiconductor device in accordance with an embodiment of the present invention. FIG. 2A illustrates a top view and FIG. 2B illustrates a cross sectional view.

Unlike the embodiment of the prior embodiment, in this embodiment the first circuit 1 encloses or surrounds the second circuit 2 such that the isolation regions 30 surround both the first circuit 1 and the second circuit 2. As in prior embodiments, the chip isolation regions 40 surround the second circuit 2.

Figure 3:
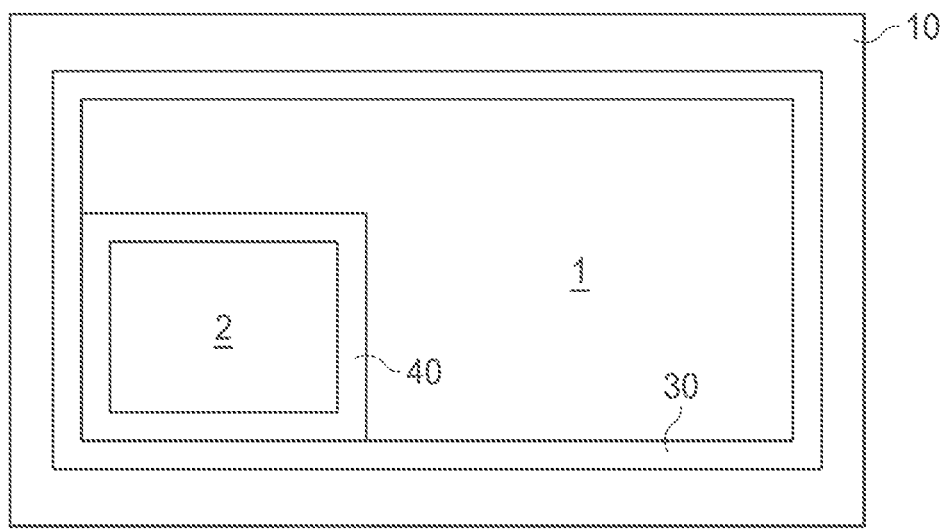
FIG. 3 illustrates a semiconductor device in accordance with an embodiment of the present invention.

FIG. 3 illustrates a semiconductor device in accordance with an embodiment of the present invention.

Unlike the prior embodiments, the second circuit 2 is formed on one side of the first circuit 1 such that the second circuit 2 is surrounded by the first circuit 1 from two sides. Thus, in this embodiment, the first circuit 1 is formed as a "L" shaped region. Along one side of the second circuit 2, the chip isolation regions 40 may be formed adjacent and contacting the isolation regions 30 in one embodiment.

FIGS. 4-10 illustrate an embodiment of forming the semiconductor device in accordance with an embodiment of the invention.

Figure 4A:
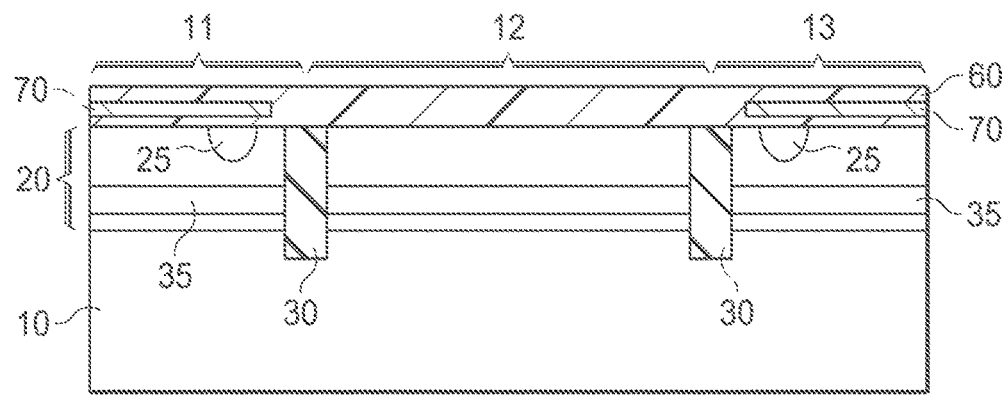
Figure 4B:
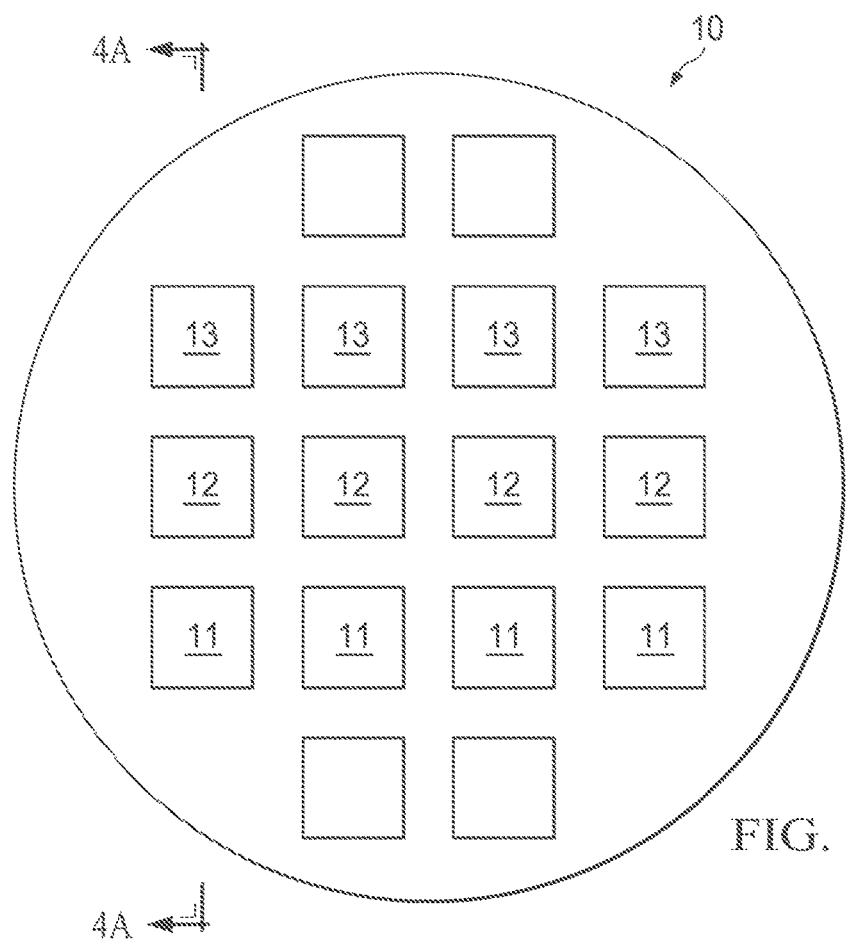

FIG. 4, which includes FIGS. 4A and 4B, illustrates a semiconductor device after the formation of device regions in accordance with embodiments of the present invention, wherein FIG. 4A illustrates a cross-sectional view, and wherein FIG. 4B illustrates a top view.

FIG. 4A illustrates a first substrate 10 with a first region 11, a second region 12, and a third region 13. The second region 12 is disposed between the first region 11 and the third region 13. The first substrate 10 may comprise a bulk silicon substrate, for example, having a (100) surface. In various embodiments, the first substrate 10 may comprise a semiconductor on insulator (SOI) material such as silicon on oxide. In one or more embodiments, the first substrate 10 may comprise other semiconductor materials such as SiGe, SiC, graphene, including compound semiconductors such as GaN, GaAs, GaP, GaSb, InP, InSb, SbAs, and combinations thereof. In one or more embodiments, the substrate 10 may be doped with a n-type or p-type doping to reduce resistance and may include epitaxial layers.

In various embodiments, isolation regions 30 may be formed in the substrate 10. For example, a hard mask layer (not shown here), such as silicon nitride, can be formed over the first substrate 10 and patterned to expose the isolation areas. The exposed portions of the first substrate 10 can then be etched to the appropriate depth, e.g., between about 200 nm and about 500 nm. The trenches are then filled with an isolating material. For example, exposed silicon surfaces can be thermally oxidized to form a thin oxide layer. The trenches can then be lined with a first material such as a nitride layer (e.g., $Si_3N_4$). The trenches can then be filled with a second material, such as an oxide. For example, a high density plasma (HDP) can be performed, with the resulting fill material being referred to as HDP oxide. In other embodiments, other trench filling processes can be used. For example, while the trench is typically lined, this step can be avoided with other fill materials. The depth of the isolation regions 30 may be different depending on the type of device being isolated, e.g., high voltage devices may use a deeper isolation than lower voltage devices.

Device regions 20 may be formed between the isolation regions 30. The formation of the device regions 20 may include several processes such as masking, implantation, annealing, and others. Active regions 25 may be formed within the device regions 20. Further, source, drain, and other transistor regions may be formed.

After forming the device regions 20 between the isolation regions 30, a few levels of metallization may be formed over the first substrate 10. Accordingly, the first region 11 and the third region 13 may also include a few levels of metallization. For example, the semiconductor devices within the active regions 25 may be interconnected through the metallization levels. Further, the metallization provides contact to the active regions 25. As illustrated, a first metallization layer including substrate contact pads 70 may be formed over the substrate 10. The metallization layers may be protected during subsequent processing by a capping layer 60.

In various embodiments, the first region 11 may form the first circuit 1, the second region 12 may form the second circuit 2, and the third region 13 may form the third circuit 3 (e.g., FIG. 1A). The first region 11 and the third region 13 may form part of a power chip in one or more embodiments. The first region 11 and the third region 13 may comprise device regions 20 which may include various semiconductor devices such as diodes, field effect transistors, bipolar transistors, thyristors, and other devices. The device regions 20 may include active regions 25 for forming such devices. The device regions 20 may include various doped layers 35 in forming the semiconductor devices. In one or more embodiments, the second region 12 may not have device regions.

Referring to FIG. 4B, the first substrate 10 may be a wafer such as a silicon wafer in or more embodiments. FIG. 4B also illustrates the first region 11, the second region 12, and the third region 13 in one embodiment.

Figure 5:
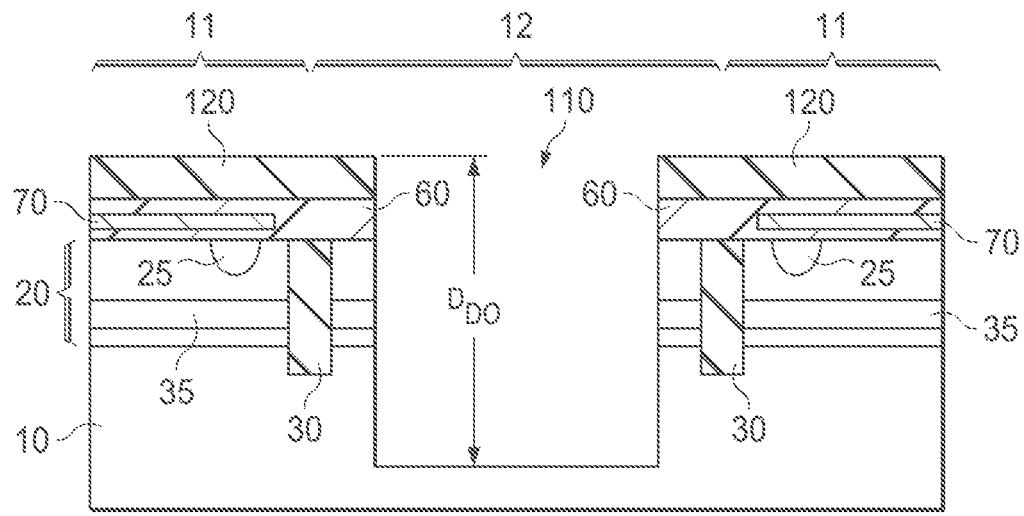
FIG. 5 illustrates a semiconductor device after the formation of die openings in accordance with embodiments of the present invention.

FIG. 5 illustrates a semiconductor device after the formation of die openings in accordance with embodiments of the present invention.

As illustrated in FIG. 5, after forming the first metallization level, die openings 110 are formed in the first substrate 10. The first region 11 and the third region 13 may be masked with hard mask layer 120. A hard mask layer 120 may be deposited over the substrate 10 followed by a photo resist layer. The hard mask layer 120 may be patterned by patterning the photo resist layer. The patterned hard mask layer 120 exposes the second region 12 while protecting the first region 11 and the third region 13. A trench etch process may be performed to form the die openings 110.

The hard mask layer 120 protects the capping layer 60 and the underlying device regions 20 during the subsequent trench etch process. The material of the hard mask layer 120 may be selected based on the selectivity to the etch chemistry of the etch process. For example, in one embodiment, a high density plasma with a fluorine chemistry may be subsequently used to etch the die openings 110, and the hard mask layer 120 comprises a $SiO_2$ hard mask. The hard mask layer 120 may comprise an inorganic dielectric layer such as a silicon oxide layer in various embodiments. Alternatively, the hard mask layer 120 comprises silicon nitride. In an alternative embodiment, the hard mask layer 120 may comprise an imide layer.

The hard mask layer 120 may have a thickness of about 100 nm to about 500 nm in various embodiments. In one or more embodiments, the hard mask layer 120 may have a thickness of about 100 nm to about 300 nm. In one or more embodiments, the hard mask layer 120 may have a thickness of about 100 nm to about 2000 nm. The hard mask layer 120 may be formed using deposition techniques or coated in various embodiments. The formation of the hard mask layer 120 may include a baking process.

The die openings 110 may be formed in the substrate 10 using an etching process. In one or more embodiments, an anisotropic etch such as a reactive ion etch process may be used.

In various embodiments, the depth $D_{DO}$ of the die openings 110 may be about 20 μm to about 100 μm. In one or more embodiments, the depth $D_{DO}$ of the die openings 110 may be about 20 μm to about 200 μm. In one or more embodiments, the depth $D_{DO}$ of the die openings 110 may be about 20 μm to about 80 μm. In various embodiments, the depth $D_{DO}$ of the die openings 110 may be about 10 μm to about 40 μm. In various embodiments, the depth $D_{DO}$ of the die openings 110 may be about 30 μm to about 50 μm.

Figure 6A:
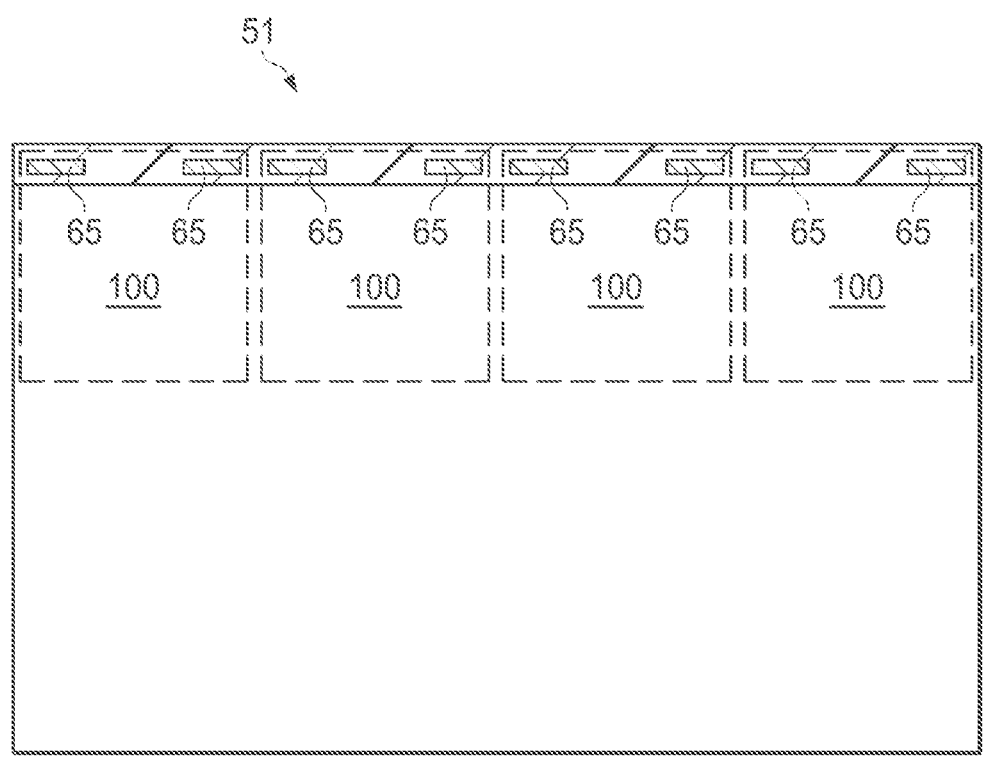
FIG. 6A-6C, illustrates the formation of an integrated circuit chip in accordance with embodiments of the present invention.
Figure 6B:
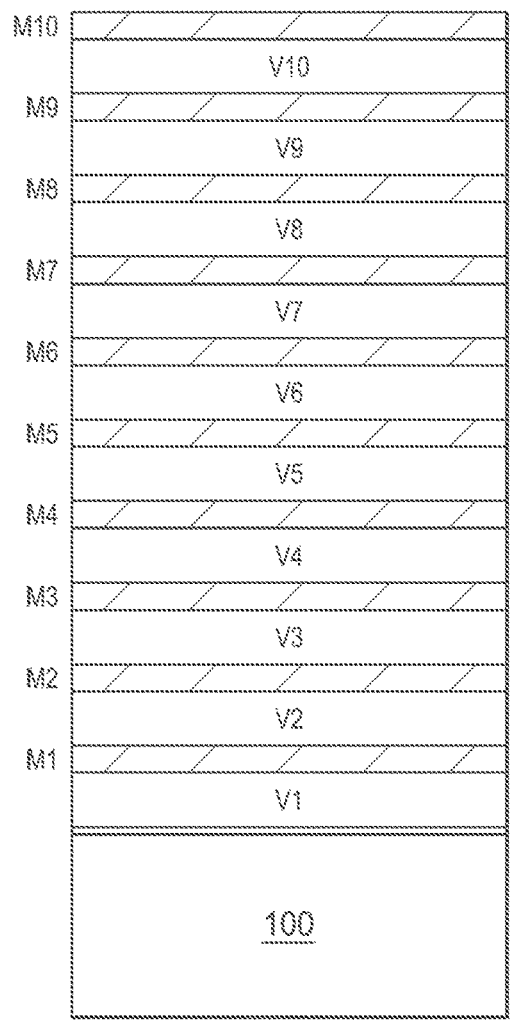
Figure 6C:
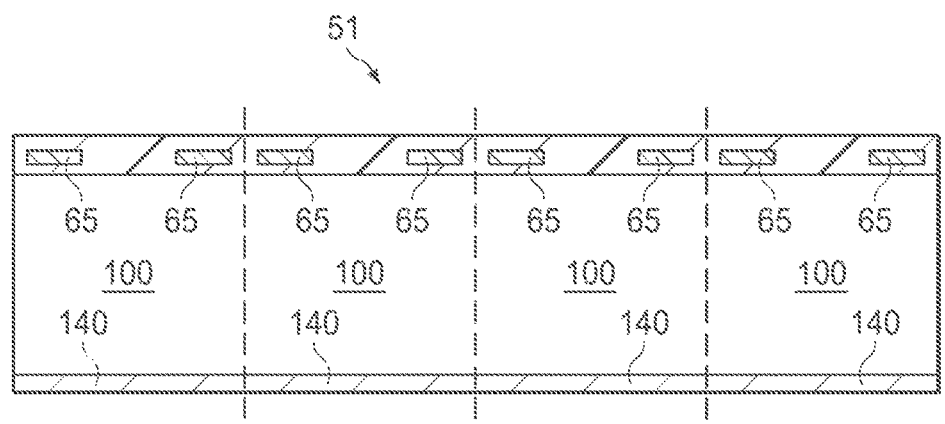

FIG. 6, which includes FIG. 6A-6C, illustrates the formation of an integrated circuit chip in accordance with embodiments of the present invention.

Referring to FIG. 6A, a plurality of semiconductor dies 100 is formed within a second substrate 51. The second substrate 51 may comprise silicon wafer in one or more embodiments. The second substrate 51 may comprise a bulk silicon substrate, for example, having a (100) surface. In various embodiments, the second substrate 51 may comprise a semiconductor on insulator (SOI) material such as silicon on oxide. In one or more embodiments, the second substrate 51 may comprise other semiconductor materials such as SiGe, SiC, graphene, including compound semiconductors such as GaN, GaAs, GaP, GaSb, InP, InSb, SbAs, and combinations thereof. In one or more embodiments, the second substrate 51 may be doped with an n-type or p-type doping to reduce resistance and may include epitaxial layers.

Active regions may be formed proximate the top surface of the second substrate 51. The active regions may comprise diodes, transistors, thyristors, and other devices, in various embodiments. The second substrate 510 may also include passive devices such as capacitors, inductors, resistors in one or more embodiments.

The plurality of semiconductor dies 100 may be a highly integrated chip with many levels of metallization in one or more embodiments. In various embodiments, each of the plurality of semiconductor dies 100 may comprise a logic chip, a memory chip, an analog chip, a mixed signal chip, and other types of circuitry. The active circuitry of the plurality of semiconductor dies 100 may comprise active device regions and may include necessary transistors, resistors, capacitors, inductors or other components used to form integrated circuits. For example, active areas that include transistors (e.g., CMOS transistors) can be separated from one another by isolation regions (e.g., shallow trench isolation).

Next, metallization is formed over the active device regions to electrically contact and interconnect the active devices. The metallization and active device regions together form a completed functional integrated circuit. In other words, the electrical functions of each of the plurality of semiconductor dies 100 can be performed by the interconnected active circuitry. In logic devices, the metallization may include many layers, e.g., nine or more, of copper or alternatively of other metals. In memory devices, such as DRAMs, the number of metal levels may be less and may be aluminum. In one or more embodiments, the plurality of semiconductor dies 100 may comprise at least four metal levels. The plurality of semiconductor dies 100 may comprise at least 10 metal levels as illustrated in the magnified cross-sectional view of FIG. 6B.

FIG. 6B illustrates a magnified view illustrating a plurality of metal levels (M1-M10) and a plurality of via levels (V1-V10) formed over the second substrate 51. In FIG. 6B, ten metal levels are stacked vertically, and comprise metal line levels $M_1$, $M_2$, $M_3$, $M_4$, $M_5$, $M_6$, $M_7$, $M_8$, $M_9$, and $M_{10}$ connected by via levels $V_1$, $V_2$, $V_3$, $V_4$, $V_5$, $V_6$, $V_7$, $V_8$, $V_9$, and $V_{10}$. In other embodiments, more or less number of metal and via levels may be used. In various embodiments of the present invention, the metal and via levels may be formed using a single damascene process or a dual damascene process. In a single damascene process, a single layer of insulating material is patterned with a pattern for conductive features, such as conductive lines, conductive vias. In contrast, in a dual damascene process, the vias and metals lines are patterned for conductive features and filled in a single fill step with a conductive material.

The metallization levels of the second substrate 51 may include an uppermost metal level for contacting with external circuitry. For example, the uppermost metal level may include die contact pads 65.

As next illustrated in FIG. 6C, the second substrate 51 is singulated to form the plurality of semiconductor dies 100. The dashed lines illustrate the dicing channels or scribe lines through which dicing is performed. In various embodiments, prior to singulation, the second substrate 51 may be thinned from the back side (side opposite the active regions 25). The thinning may be performed by a back side grinding process in one or more embodiments. After the thinning, a back side conductor 140 may be deposited on the exposed back surface of the second substrate 51. The back side conductor 140 may comprise aluminum in one embodiment.

In various embodiments, the metallization levels over the plurality of semiconductor dies 100 is different from the metallization levels over the first substrate 10. In one or more embodiments, the number of metallization levels over the plurality of semiconductor dies 100 is higher than the number of metallization levels over the first substrate 10.

Figure 7:
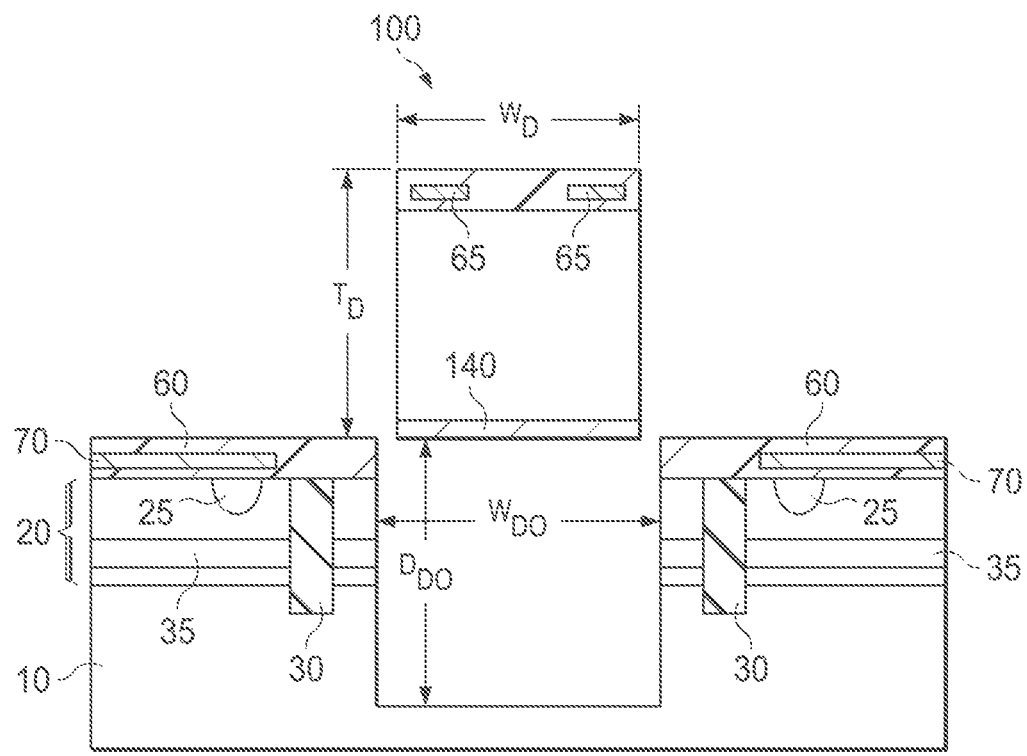
FIG. 7 illustrates a semiconductor device while placing the semiconductor die within the die openings of the first substrate in accordance with an embodiment of the present invention.

FIG. 7 illustrates a semiconductor device after aligning the semiconductor die within the die openings of the first substrate in accordance with an embodiment of the present invention.

Referring to FIG. 7, the plurality of semiconductor dies 100 are placed within the die openings 120 of the first substrate 10. In various embodiments, each of the plurality of semiconductor dies 100 may be separately aligned and placed within the die openings 110. Suitable techniques for lateral and vertical alignment of the plurality of semiconductor dies 100 may be used in various embodiments.

In various embodiments, the width of the die openings $W_{DO}$ is greater than the width of the semiconductor die $W_D$ by at least 10%. In various embodiments, the width of the die openings $W_{DO}$ is greater than the width of the semiconductor die $W_D$ by at least 5%. In various embodiments, the width of the die openings $W_{DO}$ is greater than the width of the semiconductor die $W_D$ by at least 20%. In various embodiments, the width of the die openings $W_{DO}$ is greater than the width of the semiconductor die $W_D$ by about 5% to about 20%. Further, the depth $D_{DO}$ of the die openings 110 is about the same as the thickness $T_D$ of the semiconductor die 100. In various embodiments, the depth $D_{DO}$ of the die openings 110 is 0.9 to about 1.1 times the thickness $T_D$ of the semiconductor die 100. In various embodiments, the depth $D_{DO}$ of the die openings 110 is 0.95 to about 1.05 times the thickness $T_D$ of the semiconductor die 100.

Figure 8:
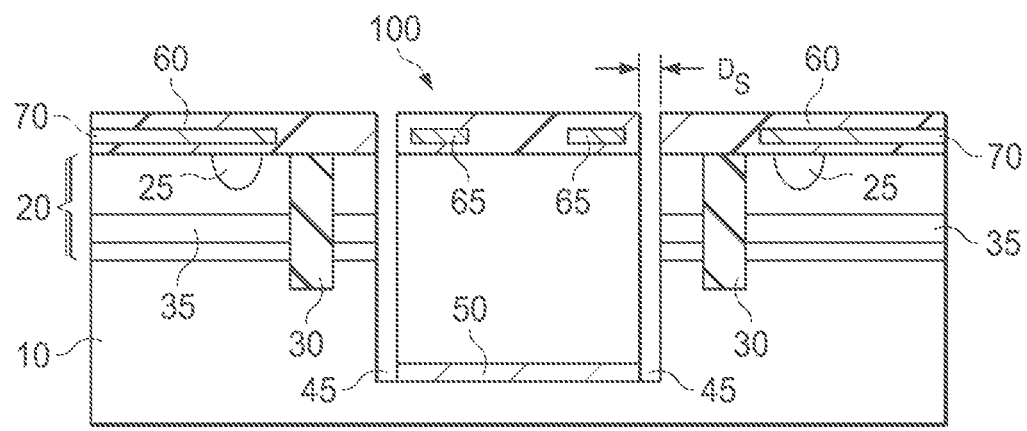
FIG. 8 illustrates a semiconductor device after attaching the semiconductor die to the first substrate in accordance with an embodiment of the present invention.

FIG. 8 illustrates a semiconductor device after attaching the semiconductor die to the first substrate in accordance with an embodiment of the present invention.

Referring next to FIG. 8, the plurality of semiconductor dies 100 are attached to the first substrate 10, for example, using a thermal process. In one or more embodiments, the plurality of semiconductor dies 100 is placed within the die openings 110 at higher temperatures. Alternatively, a heat treatment may be performed after placing all the plurality of semiconductor dies within all the die openings 120 of the first substrate 10. The heat treatment may result in the formation of a bond between the plurality of semiconductor dies 100 and the first substrate 10. In one embodiment, the atoms of the back side conductor 140 may intermix and/or react with the atoms of the first substrate 10 to form a mechanically stable bond. Thus, a conductive adhesive layer 50 is formed.

After the bonding of the plurality of semiconductor dies 100 with the first substrate 10, an opening 45 having a critical dimension of about $D_S$ is formed. In various embodiments, the critical dimension $D_S$ of the opening 45 is about 2 µm to about 10 µm. In one or more embodiments, the critical dimension $D_S$ of the opening 45 is about 4 µm to about 6 µm.

Figure 9:
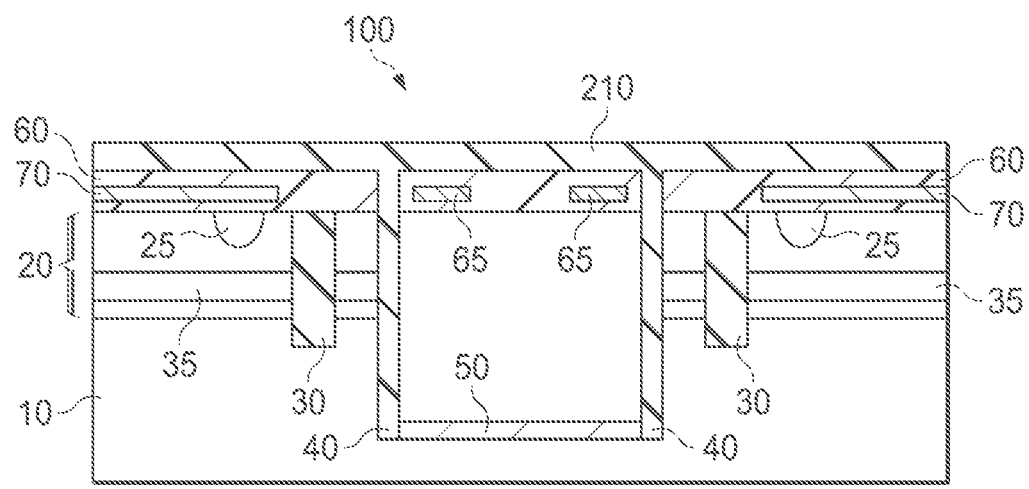
FIG. 9 illustrates a semiconductor device after filling the spaces between the substrate and the semiconductor die with a dielectric material in accordance with an embodiment of the present invention.

FIG. 9 illustrates a semiconductor device after filling the spaces between the first substrate and the semiconductor die with a dielectric material in accordance with an embodiment of the present invention.

Referring to FIG. 9, a dielectric material 210 is formed over the first substrate 10. The dielectric material 210 fills the opening 45 in one or more embodiments. In one or more embodiments, the dielectric material 210 may be deposited using a high aspect ratio fill process so as to fill the high aspect ratio opening 45. In one or more embodiments, the dielectric material 210 may be deposited using a high density plasma chemical vapor deposition (HDP CVD) process. Alternatively, the dielectric material 210 may be deposited using other processes such as spin coating, chemical vapor deposition, plasma vapor deposition, and other deposition processes. The dielectric material 210 may be planarized using a chemical and/or mechanical polishing process. Alternatively, the dielectric material 210 may be formed as a planarized surface, e.g., using a coating process.

The first substrate 10 now includes the semiconductor die 100, which may be processed along with the other circuits of the first substrate 10 similar to embedded wafer level processing. However, unlike embedded wafer level processing, the first substrate 10 comprises a homogeneous material without differences in coefficient of thermal expansion. For example, in conventional embedded wafer level processing, the dies are embedded within a mold compound. However, the dies have different thermal expansion coefficient than the mold compound, which can result in stress-related figure during processing and/or operation.

Figure 10A:
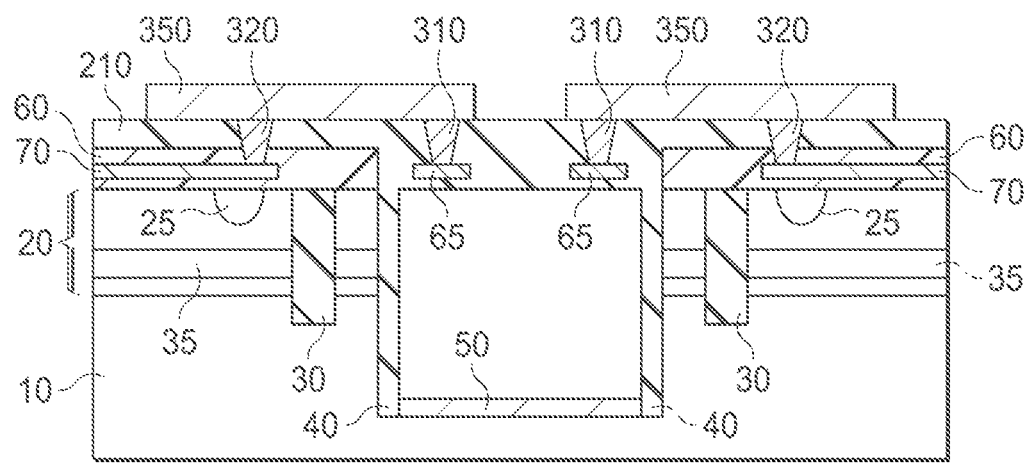
FIGS. 10A and 10B, illustrates a semiconductor device after forming external contact pads in accordance with an embodiment of the present invention.
Figure 10B:
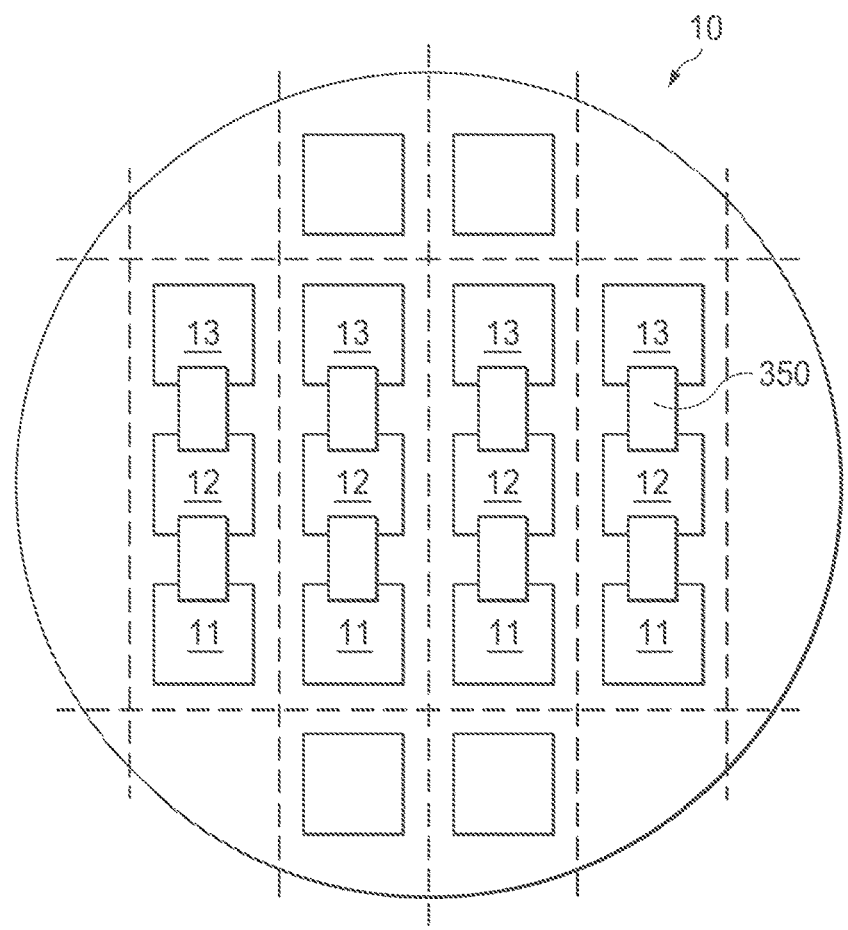

FIG. 10, which includes FIGS. 10A and 10B, illustrates a semiconductor device after forming external contact pads in accordance with an embodiment of the present invention. FIG. 10A illustrates a cross-sectional view while FIG. 10B illustrates a top view.

Referring to FIG. 10, additional metal levels may be formed over and/or within the dielectric material 210. For example, in one embodiment, at least one via level may be formed within the dielectric material 210. Alternatively, additional metal levels may be formed over a inter level dielectric formed over the dielectric material 210.

As illustrated, a die contact via 310 may be used to couple a chip contact pad 350 with the die contact pads 65 of the semiconductor die 100. A substrate contact via 320 may be used to couple the chip contact pad 350 with the substrate contact pads 70.

The first substrate 10 may be singulated to form a chip comprising circuitry from the first region 11, the second region 12, and the third region 13. The second region 12 includes the semiconductor die 100. Prior to singulation, the first substrate 10 may be optionally be thinned from the back side.

Figure 11:
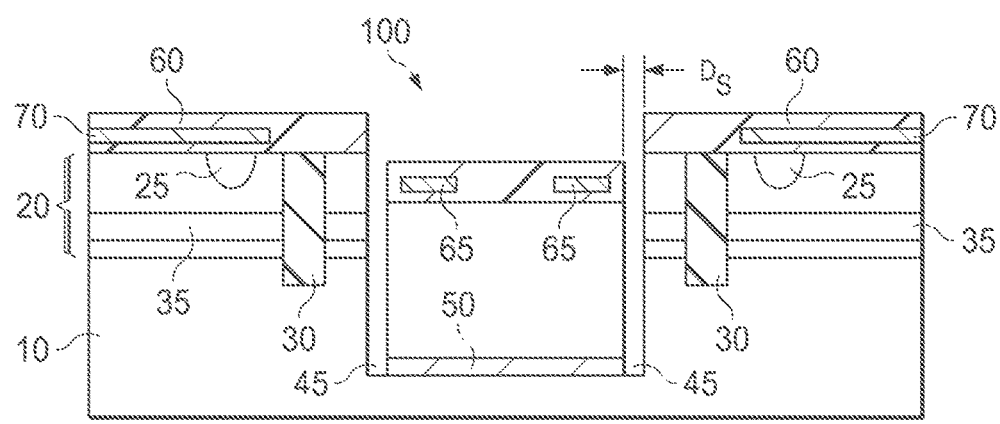
FIG. 11 illustrates a semiconductor device after attaching a semiconductor die formed previously in another substrate to a first substrate in accordance with an alternative embodiment of the present invention.
Figure 12:
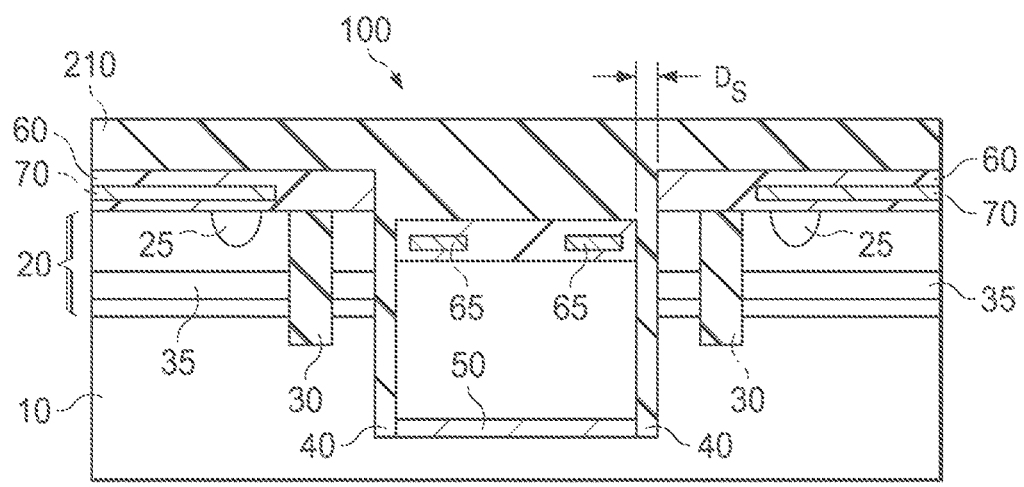
FIG. 12 illustrates a semiconductor device after filling the gap or spacing between the semiconductor die and the first substrate with a dielectric material in accordance with an alternative embodiment of the present invention.
Figure 13:
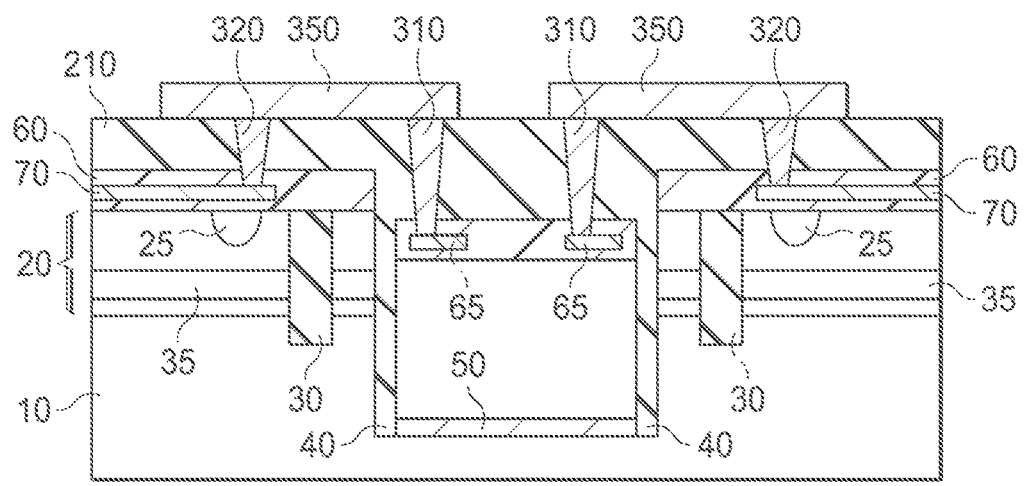
FIG. 13 illustrates a semiconductor device after forming metallization levels over the first substrate and the semiconductor die in accordance with an alternative embodiment of the present invention.

FIGS. 11-13 illustrate a semiconductor device during various stages of fabrication in accordance with an alternative embodiment of the present invention.

Unlike, the prior embodiment, this embodiment illustrates a case when the thickness of the semiconductor die does not match the depth of the die opening.

This process begins as described in FIGS. 4-7. FIG. 11 illustrates a semiconductor device after attaching a semiconductor die 100 formed previously in another substrate to a first substrate 10 in accordance with an alternative embodiment of the present invention. Referring to FIG. 11, in one embodiment, the plurality of semiconductor dies 100 is thinner than the depth of the die openings 110.

FIG. 12 illustrates a semiconductor device after filling the gap or spacing between the semiconductor die 100 and the first substrate 10 with a dielectric material 210 in accordance with an alternative embodiment of the present invention. After attaching the plurality of semiconductor dies 100 to the first substrate 10 as in the prior embodiment, a dielectric material 210 is formed over the first substrate 10 and planarized as illustrated in FIG. 12.

FIG. 13 illustrates a semiconductor device after forming metallization levels over the first substrate and the semiconductor die in accordance with an alternative embodiment of the present invention. A plurality of contacts is formed over the first substrate 10. A substrate contact via 320 may be formed to couple to the substrate contact pads 70. Further, die contact vias 310 may be formed to couple to the die contact pads 65. The length of the die contact vias 310 is different from the substrate contact vias 320. In various embodiments, the die contact vias 310 and the substrate contact vias 320 may be formed simultaneously in a damascene process. Alternatively, in some embodiments, the die contact vias 310 and the substrate contact vias 320 may be formed sequentially. Thus, embodiments of the invention may be used even if the chip thickness differ due to process variations and/or design reasons.

As described in various embodiments, a material that comprises a metal may, for example, be a pure metal, a metal alloy, a metal compound, an intermetallic and others, i.e., any material that includes metal atoms. For example, copper may be a pure copper or any material including copper such as, but not limited to, a copper alloy, a copper compound, a copper intermetallic, an insulator comprising copper, and a semiconductor comprising copper.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-13 may be combined with the each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:

providing a semiconductor substrate comprising a bulk region, forming two or more doped device regions at a first major surface of the semiconductor substrate such that the bulk region is separated from the first major surface by the two or more doped device regions;

forming a first doped region extending from the main surface into one of the doped device regions, forming an opening from the first major surface into the semiconductor substrate, the opening extending through the two or more doped device regions into the bulk region;

attaching a semiconductor die to the semiconductor substrate at the opening, the semiconductor die comprising a second semiconductor device, wherein the second semiconductor device is a different type of semiconductor material than the first semiconductor device, wherein the attaching comprises heating the semiconductor substrate to form a conductive bond between a bottom major surface of the semiconductor die and the semiconductor substrate, wherein the semiconductor die is electrically connected to the semiconductor substrate through the conductive bond;

forming a chip isolation region on sidewalls of the opening and surrounding the second semiconductor device;

forming a chip contact pad and a pair of vias connecting the semiconductor die with the first doped region, wherein the pair of vias comprise a first via contacting a top major surface of the semiconductor die and a second via extending through the first major surface towards the first doped region, the first via being longer than the second via, wherein the first via is coupled to the second via through the chip contact pad, and wherein the chip contact pad provides external contact to the semiconductor die and first semiconductor device; and singulating the semiconductor substrate.

2. A method of forming a semiconductor device, the method comprising:

providing a semiconductor substrate comprising a first major surface and a first semiconductor device;

forming an opening in a portion of the semiconductor substrate adjacent to the first semiconductor device, the opening comprising outer sidewalls that extend from the first major surface into the semiconductor substrate and a bottom that extends between the outer sidewalls;

providing a semiconductor die that comprises a rear side metallization;

inserting the semiconductor die in the opening while the outer sidewalls of the opening are exposed semiconductor surfaces such that the rear side metallization of the semiconductor die contacts the bottom of the opening and such that outer sides of the semiconductor die face the exposed semiconductor surfaces of the outer sidewalls; and attaching the semiconductor die to the semiconductor substrate by forming a mechanically stable bond between the semiconductor substrate and the rear side metallization at the bottom of the opening, wherein the attaching comprises heating the semiconductor substrate to form a conductive bond between a bottom major surface of the semiconductor die and the semiconductor substrate, wherein the semiconductor die is electrically connected to the semiconductor substrate through the conductive bond, and wherein, after the attaching, the conductive bond is separated from a second major surface of the substrate by a bulk region of the semiconductor substrate, the second major surface being opposite from the first major surface.

3. The method of claim 2, further comprising, after attaching the semiconductor die to the semiconductor substrate:

filling a gap in the opening between the outer sides of the semiconductor die and the exposed semiconductor surfaces of the outer sidewalls with a dielectric material.

4. The method of claim 3, wherein filling the gap comprises completely filling the gap with the dielectric material such that the dielectric material extends from the first major surface to the bottom of the opening.

5. The method of claim 3, wherein filling the gap comprises forming a first dielectric isolation region that electrically insulates the semiconductor die from the semiconductor substrate, and wherein the method further comprises:

forming a second isolation region in the semiconductor substrate that forms an enclosed loop around the first semiconductor device, the second isolation region comprising a dielectric insulator that extends from the first major surface into the substrate.

6. The method of claim 5, wherein the first isolation region extends deeper into the semiconductor substrate than the second isolation region.

7. The method of claim 5, wherein the second isolation region is formed before inserting the semiconductor die in the opening.

8. The method of claim 5, wherein the second isolation region comprises a dielectric section that is disposed between the first dielectric isolation region and the first semiconductor device.

9. The method of claim 5, wherein both of the first and second isolation regions form an enclosed loop around the semiconductor die.

10. The method of claim 7, wherein the enclosed loop formed by the first isolation region is disposed in a corner of the enclosed loop formed by the second isolation region.

11. The method of claim 8, wherein outer sides of the second isolation region directly contact inner sides of the first isolation region, and wherein a portion of the semiconductor substrate that is enclosed by the second isolation region and is outside of the first isolation region forms an L-shape.

12. The method of claim 2, wherein the semiconductor substrate comprises a first semiconductor material, and wherein the semiconductor die comprises a second semiconductor material that is different from the first semiconductor material.

13. The method of claim 12, wherein the semiconductor substrate comprises at least one of: silicon, or silicon carbide, or silicon germanium, and wherein the semiconductor die comprises at least one of: type III-V semiconductor material, or type II-IV semiconductor material.

14. The method of claim 12, wherein the first semiconductor device is configured as a power device, and wherein the semiconductor die is configured as a logic chip.

15. The method of claim 12, further comprising electrically connecting the first semiconductor device to the semiconductor die such that the first semiconductor device is configured to power the semiconductor die.

16. The method of claim 15, wherein electrically connecting the first semiconductor device to the semiconductor die comprises forming at least one metallization layer on the substrate after attaching the semiconductor die.

17. The method of claim 2, wherein the semiconductor die is inserted in the opening while the bottom of the opening is an exposed semiconductor surface.

* * * * *